(12) United States Patent
Li

(10) Patent No.: US 11,315,984 B2
(45) Date of Patent: Apr. 26, 2022

(54) COLOR FILTER SUBSTRATE, MANUFACTURING METHOD THEREOF, AND OLED DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Yuanyuan Li, Shenzhen (CN)

( * ) Notice: Subject to any disclaimer, the term of this patent is extended or adjusted under 35 U.S.C. 154(b) by 338 days.

(21) Appl. No.: 16/626,337

(22) PCT Filed: Nov. 11, 2019

(86) PCT No.: PCT/CN2019/117243
§ 371 (c)(1),
(2) Date: Dec. 24, 2019

(87) PCT Pub. No.: WO2021/056725
PCT Pub. Date: Apr. 1, 2021

(65) Prior Publication Data
US 2021/0335891 A1    Oct. 28, 2021

(30) Foreign Application Priority Data

Sep. 24, 2019   (CN) .......................... 201910902826.X

(51) Int. Cl.
*H01L 27/32* (2006.01)
*G02B 5/20* (2006.01)

(52) U.S. Cl.
CPC .......... *H01L 27/322* (2013.01); *G02B 5/201* (2013.01); *G02B 5/205* (2013.01)

(58) Field of Classification Search
CPC ............... H01L 27/322; H01L 27/3244; H01L 27/3246; H01L 51/56; G02B 5/201; G02B 5/205; G02B 5/003
See application file for complete search history.

(56) References Cited

U.S. PATENT DOCUMENTS

| 6,410,214 | B1 * | 6/2002 | Kim .................... H01J 9/20 430/321 |
| 8,981,386 | B2 | 3/2015 | Lim et al. |
| 2005/0179117 | A1 * | 8/2005 | Lee ................... H01J 11/38 257/650 |
| 2012/0268700 | A1 | 10/2012 | Shu et al. |
| 2019/0081282 | A1 | 3/2019 | Li |

FOREIGN PATENT DOCUMENTS

| CN | 102707352 A | 10/2012 |
| CN | 105445996 A | 3/2016 |
| CN | 105929607 A | 9/2016 |

(Continued)

*Primary Examiner* — Seung C Sohn

(57) ABSTRACT

The present disclosure relates to a color filter substrate, a manufacturing method thereof, and an OLED display device. The color filter substrate comprises a substrate, a black matrix, a plurality of color resists, and a plurality of isolation walls. The present disclosure disposes the plurality of isolation walls on the black matrix and between two adjacent color resists, thereby preventing light crosstalk between the adjacent color resists and preventing color mixing, and therefore improving display effect.

10 Claims, 2 Drawing Sheets

(56) References Cited

FOREIGN PATENT DOCUMENTS

| | | | |
|---|---|---|---|
| CN | 106125411 | A | 11/2016 |
| CN | 106324893 | A | 1/2017 |
| CN | 107591430 | A | 1/2018 |
| CN | 107731873 | A | 2/2018 |
| CN | 108873492 | A | 11/2018 |
| CN | 109932770 | A | 6/2019 |
| JP | 2014153519 | A | 8/2014 |

* cited by examiner

COLOR FILTER SUBSTRATE, MANUFACTURING METHOD THEREOF, AND OLED DISPLAY DEVICE

FIELD OF INVENTION

The present disclosure relates to the field of display technologies, and more particularly, to a color filter substrate, a manufacturing method thereof, and an OLED display device.

BACKGROUND OF INVENTION

Organic light-emitting diode (OLED) display devices are also known as organic electroluminescence display devices or organic light-emitting semiconductors.

Firstly, OLEDs have self-luminous characteristics and are not like thin film transistor-liquid crystal displays (TFT-LCDs) which need a backlight, so visibility and brightness thereof are high. Secondly, since OLEDs have advantages of low voltage requirements, high power saving efficiency, fast response times, light weight, thinness, simple structures, low cost, wide viewing angles, high contrast, and low power consumption, they have become one of the most important display technologies currently, and are gradually substituting TFT-LCDs. They are expected to become the next generation of the mainstream display technology after LCDs.

A basic structure of an OLED is a sandwich structure which is generally formed by stacking an anode, a light-emitting material, and a cathode. The whole structure layer comprises a hole transport layer (HTL), a light-emitting layer (EL), and an electron transport layer (ETL). When an electric power is applied to a moderate voltage, holes in a positive electrode and electrons in a cathode will combine in the light-emitting layer and form excitons (electron-hole pairs) which are in an excited state by a certain probability under the effect of Coulomb forces. The excited state is not stable in an ordinary environment, and the excitons in the excited state will transfer an energy to the light-emitting material and make the light-emitting material excited from a ground state energy level to an excited state. An energy of the excited state generates photons by the process of radiation relaxation, thereby releasing light energy and producing light. Three primary colors of red, green, and blue are produced depending on different formulas and constitute basic color.

OLEDs can be divided into three types according to light-emitting directions: emitted from the bottom (bottom emission), emitted from the top (top emission), and emitted from both sides (both side emission). Wherein, a transparent anode of a bottom emission OLED device is disposed on a transparent substrate, multiple layers of organic film layers are disposed on the transparent anode, and a total reflection metal or an alloy cathode is disposed on the organic film layers, so light can only emit from an direction from the anode to the substrate. However, a top emission OLED device is different. An anode thereof is a total reflection metal and a top cathode is a very thin translucent metal or alloy film, so light emits from the top cathode.

Technical problem: there is a distance between a light-emitting substrate of current OLED display devices and a color filter substrate, so light easily produces crosstalk between adjacent sub-pixel units of the color filter substrate, thereby affecting display effect. Therefore, a new type of color filter substrate and an OLED display device including the color filter substrate are needed to solve the above problems.

SUMMARY OF INVENTION

An objective of the present disclosure is to provide a color filter substrate, a manufacturing method thereof, and an OLED display device that can solve the problem of light crosstalk in current OLED display devices.

To solve the above problem, an embodiment of the present disclosure provides a color filter substrate which comprises a substrate, a black matrix, a plurality of color resists, and a plurality of isolation walls. Wherein, the black matrix is disposed on the substrate and provided with a plurality of openings arranged at intervals in a matrix. The isolation walls are disposed between adjacent color resists and on the black matrix.

Further, a plurality of grooves are disposed on the black matrix and between two of the adjacent color resists, and the isolation walls are disposed on the grooves of the black matrix.

Further, the grooves comprise one or more of rectangular grooves, serrated grooves, wavy grooves, and arc-shaped grooves.

Further, a constituent material of the isolation walls comprises a black polyimide (PI) material.

Further, a surface of the isolation walls away from the substrate is flush with a surface of the color resists away from the substrate.

Another embodiment of the present disclosure provides a manufacturing method of the color filter substrate. The method comprises: step S1: providing the substrate, manufacturing the black matrix on the substrate by coating, baking, exposing, and developing processes, arranging the openings at intervals in a matrix on the black matrix, and disposing the color resists in the openings; and step S2: disposing the isolation walls on the black matrix and between the adjacent color resists.

Further, wherein in the step S2, a plurality of grooves are manufactured on the black matrix and between the adjacent color resists first, and then the isolation walls are formed in the grooves.

Further, wherein in the step S2, the isolation walls are formed by printing or coating an isolation wall material to fill into the grooves and then irradiating the isolation wall material with ultraviolet light.

Further, a material of the isolation walls comprises a black polyimide (PI) material.

Another embodiment of the present disclosure further provides an OLED display device which comprises a color filter substrate and an OLED device. Wherein the color filter substrate is the color filter substrate of the present disclosure, and the color filter substrate is disposed on the OLED device.

Beneficial Effect:

The present disclosure relates to a color filter substrate, a manufacturing method thereof, and an OLED display device. The present disclosure disposes a plurality of isolation walls on a black matrix and between two adjacent color resists, thereby preventing light crosstalk between adjacent color resists and preventing color mixing, and therefore improving display effect.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION OF PREFERRED EMBODIMENTS

Figure 1:
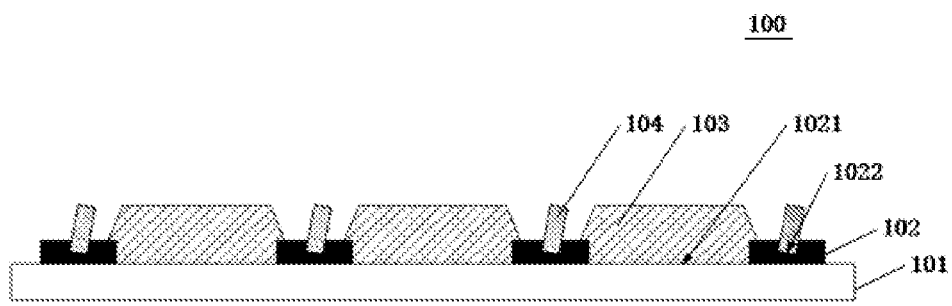
FIG. 1 is a schematic structural diagram of a color filter substrate according to an embodiment of the present disclosure.

The preferred embodiments of the present disclosure are described in detail below with reference to the accompanying drawings. The specific embodiments described with reference to the attached drawings are all exemplary and are intended to illustrate and interpret the present disclosure to make the skilled in the art easier to understand how to implement the present disclosure. The disclosure herein provides many different embodiments or examples for realizing different structures of the present disclosure. They are only examples and are not intended to limit the present disclosure.

In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

In the accompanying drawings, wherein the identical or similar reference numerals constantly denote the identical or similar elements or elements having the identical or similar functions. In the drawings, structurally identical components are denoted by the same reference numerals, and structural or functionally similar components are denoted by like reference numerals. Moreover, a size and a thickness of each component shown in the drawings are arbitrarily shown for ease of understanding and description, and the present disclosure does not limit the size and thickness of each component.

When a component is described as "on" another component, the component can be placed directly on the other component; an intermediate component can also exist, the component is placed on the intermediate component, and the intermediate component is placed on another component. When a component is described as "installed to" or "connected to" another component, it can be understood as directly "installed to" or "connected to", or a component is "mounted to" or "connected to" another component through an intermediate component.

Embodiment 1

As shown in FIG. 1, a color filter substrate comprises a substrate 101, a black matrix 102, a plurality of color resists 103, and a plurality of isolation walls 104. Wherein, the black matrix 102 is disposed on the substrate 101, and the black matrix 102 is provided with a plurality of openings 1021 arranged at intervals in a matrix. The color resists 103 are coated in the openings 1021. Wherein, a plurality of grooves 1022 are disposed on the black matrix 102 and between two of the adjacent color resists 103, and the isolation walls 104 are disposed on the grooves 1022.

Wherein, the grooves 1022 may be one or more of rectangular grooves, serrated grooves, wavy grooves, and arc-shaped grooves. The grooves 1022 in the embodiment are rectangular grooves. Since black polyimide materials have certain fluidity, it is easy to position the isolation walls 104 by disposing the grooves.

Wherein, a constituent material of the isolation walls 104 comprises a black polyimide (PI) material. Specifically, by printing or coating an isolation wall material containing a black PI material on the grooves 1022, after the black PI material of the isolation wall material is irradiated by linearly polarized ultraviolet light, chemical bonds will form or break in molecular structures of the material to make polymer chains have a directional arrangement, which makes the black PI material in the isolation wall material have a predetermined angle, thereby absorbing light emitted by corresponding pixels, preventing light crosstalk between adjacent color resists 103, preventing color mixing, and improving display effect.

As shown in FIG. 1, a surface of the isolation walls 104 away from the substrate 101 is flush with a surface of the color resists 103 away from the substrate 101. Therefore, flatness of the color filter substrate 100 can be ensured.

Embodiment 2

Figure 2:
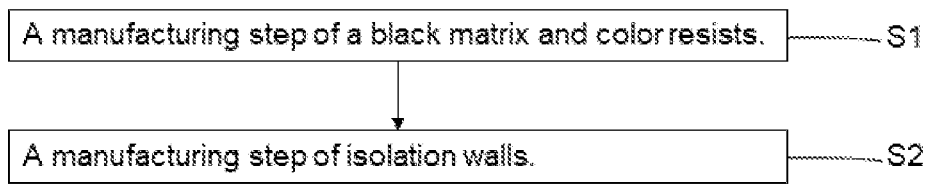
FIG. 2 is a flowchart of a manufacturing method of a color filter substrate according to an embodiment of the present disclosure.

As shown in FIG. 2, an embodiment provides a manufacturing method of a color filter substrate of the present disclosure. The method comprises step S1: a manufacturing step of a black matrix and color resists, specifically, providing the substrate 101, manufacturing the black matrix 102 on the substrate 101 by coating, baking, exposing, and developing processes, arranging the openings at intervals in a matrix on the black matrix 102, and disposing the color resists 103 in the openings; and step S2: a manufacturing step of isolation walls, specifically, manufacturing a plurality of grooves 1022 on the black matrix 102 and between the adjacent color resists 103, then printing or coating an isolation wall material containing a black PI material on the grooves 1022, irradiating the isolation wall material by ultraviolet light, and making the isolation wall material form the isolation walls 104 on the black matrix 102.

Embodiment 3

The embodiment of the present disclosure provides an OLED display device which comprises the color filter substrate 100 of the present disclosure and an OLED device 200. The color filter substrate 100 is disposed on the OLED device 200.

Figure 3:
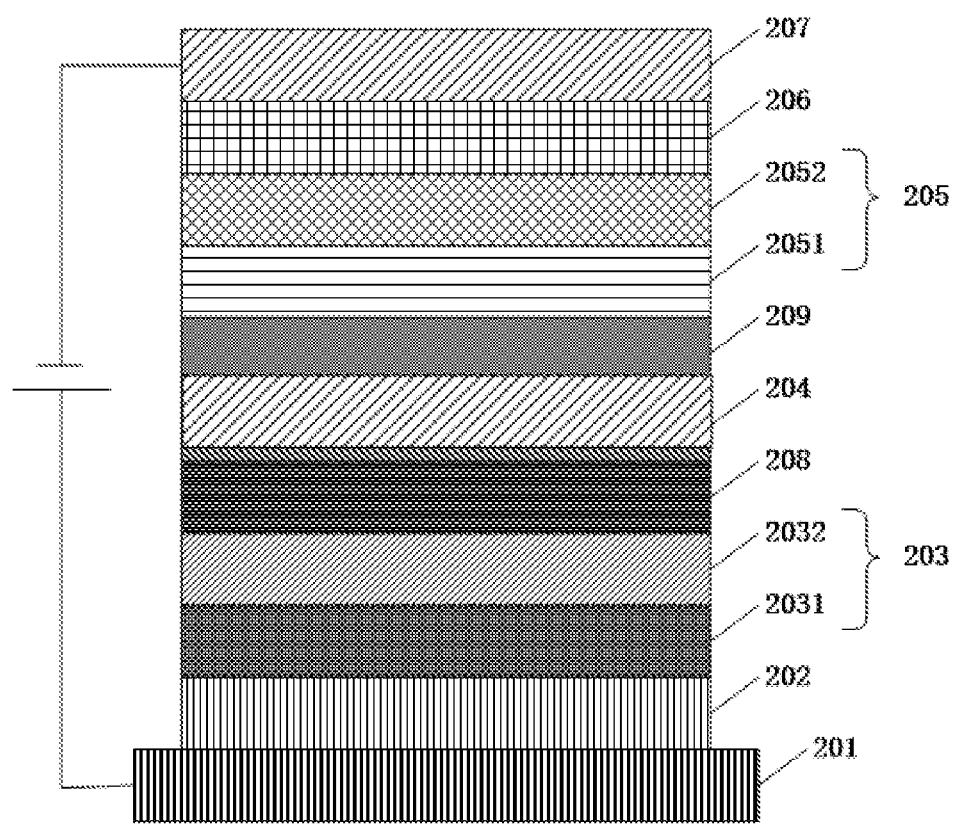
FIG. 3 is a schematic structural diagram of an OLED device of an OLED display device according to an embodiment of the present disclosure.

As shown in FIG. 3, the OLED device 200 comprises a substrate base 201, an anode layer 202, a first functional layer 203, an organic light-emitting layer 204, a second functional layer 205, a cathode layer 206, and a light extraction layer 207. The anode layer 202 is disposed on the substrate base 201, the first functional layer 203 is disposed on the anode layer 202, the organic light-emitting layer 204 is disposed on the first functional layer 203, the second functional layer 205 is disposed on the organic light-emitting layer 204, the cathode layer 206 is disposed on the second functional layer 205, and the light extraction layer 207 is disposed on the cathode layer 206.

The substrate base 201 can be glass or a TFT backboard. The TFT backboard can be a low temperature polysilicon TFT or an oxide TFT.

As shown in FIG. 3, the first functional layer 203 comprises a hole injection layer 2031 and a hole transport layer 2032. In actual manufacturing processes, the first functional layer 203 may comprise one or more of hole injection layers 2031 and hole transport layers 2032. The hole transport layer 2032 controls transportation of holes, thereby controlling combination of holes and electrons in the organic light-emitting layer 204 and improving luminous efficiency.

Wherein, the organic light-emitting layer 204 consists of light-emitting materials, and the organic light-emitting layer 204 can be manufactured by evaporation, printing, homogeneous deposition, or vapor synthesis method, but is not limited thereto.

As shown in FIG. 3, the second functional layer 205 comprises an electron transport layer 2051 and an electron injection layer 2052. In actual manufacturing processes, the second functional layer 205 may comprise one or more of electron transport layers 2051 and electron injection layers 2052. The electron transport layer 2051 controls transportation of electrons, thereby controlling combination of holes and electrons in the organic light-emitting layer 204 and improving luminous efficiency.

Wherein, the cathode layer 206 consists of a material having transmittance and conductivity. Specifically, the cathode layer can be a doped metal material or a semiconductor material.

Wherein, the light extraction layer 207 is made of a refractive material, which prevents a great refractive index difference between the cathode layer 206 and air that causes low light extraction efficiency, thereby improving light extraction efficiency.

As shown in FIG. 3, the OLED device 200 in the embodiment further comprises an electron barrier layer 208 and a hole barrier layer 209. Wherein, the electron barrier layer 208 is disposed between the organic light-emitting layer 204 and the anode layer 202, and the hole barrier layer 209 is disposed between the organic light-emitting layer 204 and the cathode layer 206. Specifically, in the embodiment, the electron barrier layer 208 is disposed between the organic light-emitting layer 204 and the hole transport layer 2032, and the hole barrier layer 209 is disposed between the organic light-emitting layer 204 and the electron transport layer 2051. Specifically, the electron barrier layer 208 can effectively prevent electrons from combining with holes in the hole transport layer 2032, thereby improving luminous efficiency; and it also can effectively isolate water vapor from entering the organic light-emitting layer 204, thereby increasing the service life of the OLED device 200. The hole barrier layer 209 can effectively prevent holes from combining with electrons in the electron transport layer 2051, thereby improving luminous efficiency; and it also can effectively isolate water vapor from entering the organic light-emitting layer 204, thereby increasing the service life of the OLED device 200.

The color filter substrate, the manufacturing method thereof, and the OLED display device provided by the present disclosure are described in detail above. The disclosure herein provides many different embodiments or examples for realizing different structures of the present disclosure, and it is understood that they are only examples and are not intended to limit the present disclosure. Descriptions of features or aspects in each exemplary embodiment should generally be considered as suitable features or aspects in other exemplary embodiments. While the disclosure has been described with reference to the preferred embodiments thereof, various modifications and changes can be made by those skilled in the art. It is understood that many changes and modifications to the described embodiment can be carried out without departing from the scope and the spirit of the disclosure that is intended to be limited only by the appended claims.

What is claimed is:

1. A color filter substrate, comprising:
   a substrate;
   a black matrix disposed on the substrate, wherein the black matrix is provided with a plurality of openings arranged at intervals in a matrix;
   a plurality of color resists coated in the openings; and
   a plurality of isolation walls disposed between adjacent color resists and on the black matrix.

2. The color filter substrate according to claim 1, wherein a plurality of grooves are disposed on the black matrix and between the adjacent color resists, and the isolation walls are disposed on the grooves of the black matrix.

3. The color filter substrate according to claim 2, wherein the grooves comprise one or more of rectangular grooves, serrated grooves, wavy grooves, and arc-shaped grooves.

4. The color filter substrate according to claim 1, wherein a constituent material of the isolation walls comprises a black polyimide (PI) material.

5. The color filter substrate according to claim 1, wherein a surface of the isolation walls away from the substrate is flush with a surface of the color resists away from the substrate.

6. A manufacturing method of the color filter substrate according to claim 1, comprising:
   providing the substrate, manufacturing the black matrix on the substrate by coating, baking, exposing, and developing processes, arranging the openings at intervals in a matrix on the black matrix, and disposing the color resists in the openings; and
   disposing the isolation walls on the black matrix and between the adjacent color resists.

7. The manufacturing method of the color filter substrate according to claim 6, wherein in the step of disposing the isolation walls on the black matrix and between the adjacent color resists, a plurality of grooves are manufactured on the black matrix and between the adjacent color resists first, and then the isolation walls are formed in the grooves.

8. The manufacturing method of the color filter substrate according to claim 7, wherein in the step of disposing the isolation walls on the black matrix and between the adjacent color resists, the isolation walls are formed by printing or coating an isolation wall material to fill into the grooves and then irradiating the isolation wall material with ultraviolet light.

9. The manufacturing method of the color filter substrate according to claim 8, wherein the isolation wall material comprises a black polyimide (PI) material.

10. An organic light-emitting diode (OLED) display device, comprising:
    the color filter substrate according to claim 1; and
    an OLED device, wherein the color filter substrate is disposed on the OLED device.

* * * * *